(12) United States Patent
Young

(10) Patent No.: US 6,429,698 B1
(45) Date of Patent: Aug. 6, 2002

(54) CLOCK MULTIPLEXER CIRCUIT WITH GLITCHLESS SWITCHING

(75) Inventor: Steven P. Young, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/563,779

(22) Filed: May 2, 2000

(51) Int. Cl.[7] .............................. H03K 5/00; G06F 1/06
(52) U.S. Cl. ......................................... 327/99; 327/409
(58) Field of Search .......................... 327/99, 409, 291, 327/294, 298

(56) References Cited

U.S. PATENT DOCUMENTS 5,517,638 A * 5/1996 Szczepanek .................. 327/99

FOREIGN PATENT DOCUMENTS

JP          402290322 A  * 11/1990 ................... 327/99

OTHER PUBLICATIONS

Peter H. Alfke, "Trouble–Free Switching Between Clocks", published First Quarter 1997 in Xilinx Publication XCell, available from Xilinx, Inc., 2100 Logic Drive, San Jose, California 95124.

* cited by examiner

Primary Examiner—Dinh T. Le
(74) Attorney, Agent, or Firm—E. Eric Hoffman, Esq.; Edel M. Young

(57) ABSTRACT

A clock routing circuit is coupled to receive a primary clock signal, a secondary clock signal, and a select signal, all of which may be asynchronous with respect to one another. When the select signal is in a first state, the clock routing circuit passes the primary clock signal as an output clock signal. When the select signal transitions to a second state, the clock routing circuit waits for the primary clock signal to transition in a predetermined direction (i.e., rising edge or falling edge). Upon detecting the transition of the primary clock signal, the clock routing circuit holds the state of the output clock signal. The clock routing circuit then waits for the secondary clock signal to transition in the predetermined direction. Upon detecting the transition of the secondary clock signal, the clock routing circuit passes the secondary clock signal as the output clock signal. By sequencing the transition between the primary clock signal and the secondary clock signal in this manner, clock signal disturbances are eliminated. In one embodiment, the predetermined direction can be selected by the user of the clock routing circuit. In another embodiment, the secondary clock signal can be replaced with a signal having a constant predetermined value, thereby causing the clock routing circuit to operate as a clock gating circuit.

20 Claims, 5 Drawing Sheets

CLOCK MULTIPLEXER CIRCUIT WITH GLITCHLESS SWITCHING

FIELD OF THE INVENTION

The present invention relates to a clock routing circuit for routing two different clock signals in a glitch-less manner.

BACKGROUND OF THE INVENTION

The timing of events is key to proper processing within integrated circuits, such as user-defined logic devices. Accordingly, a single clock is typically used as a reference to determine the timing of events. Each process may be clocked from a single distributed clock signal, providing highly synchronized processing.

However, not all processes are active at all times. Therefore, some processes do not require a continuous clock signal. Continuously providing the primary clock signal to a process that does not require such adds unnecessarily to the power consumption of the chip. A significant cause of power consumption within a user-defined logic device is the power required to distribute the primary clock signal throughout the chip.

To lessen this power consumption, some users of user-defined logic devices utilize a portion of the resources of the logic device to route a secondary clock signal in place of the primary clock signal, wherein the secondary clock signal has a frequency much less than the frequency of the primary clock signal. Routing the secondary clock signal enables the user-defined logic device to enter a low power "sleep" state. Because the power consumed when providing a low frequency clock signal to a process is less than the power consumed when providing a high frequency clock signal to the process, the power consumption of the chip is reduced. To further reduce power consumption, some user-defined logic devices are capable of gating, or preventing the routing of, the primary clock signal. One such clock gating circuit is described by Alfke et al. in commonly owned, co-pending U.S. patent application Ser. No. 09/336,357, filed Jun. 18, 1999.

In addition, some integrated circuit chips must be capable of operating in response to two separate clock signals. For example, integrated circuits that operate in accordance with the proposed PCI-X bus interface standard must be able to operate in response to both a 133 MHz clock signal and a 66 MHz clbck signal. That is, a PCI-X bus interface will typically operate in response to a 133 MHz clock signal, but must be backward compatible to operate in response to a 66 MHz clock signal.

A 2-to-1 multiplexer can be used to selectively route one of a primary clock signal and a secondary clock signal (or no clock signal). In this structure, the input terminals of the 2-to-1 multiplexer are coupled to receive the primary and secondary clock signals, and the output terminal of the multiplexer provides the selected clock signal. However, switching from one clock signal to the other can yield undesirable effects including glitches and runt pulses in the routed clock signal. In the present disclosure, a glitch or runt pulse is defined as a pulse having a width that is less than the width of the smaller of the primary or secondary clock signal.

It would therefore be desirable to have a clock routing circuit that eliminates undesirable clock signal disturbances, such as glitches and runt pulses.

SUMMARY

Accordingly, the present invention provides a clock routing circuit that is coupled to receive a primary clock signal, a secondary clock signal, and a select signal. When the select signal is in a first state, the clock routing circuit passes the primary clock signal as an output clock signal. When the select signal transitions to a second state, the clock routing circuit waits for the primary clock signal to transition in a predetermined direction (i.e., rising edge or falling edge). Upon detecting the transition of the primary clock signal, the clock routing circuit holds the state of the output clock signal. The clock routing circuit then waits for the secondary clock signal to transition in the predetermined direction. Upon detecting the transition of the secondary clock signal, the clock routing circuit passes the secondary clock signal as the output clock signal. By sequencing the transition between the primary clock signal and the secondary clock signal in this manner, clock signal disturbances are eliminated.

In one embodiment of the present invention, the primary and secondary clock signals are asynchronous. In another embodiment, the secondary clock signal can be replaced with a signal having a constant value. In yet another embodiment of the present invention, the predetermined direction can be selected by the user of the clock routing circuit. By selecting the predetermined direction to correspond with a rising edge, the output clock signal will have a logic high value when in transition. Conversely, by selecting the predetermined direction to correspond with a falling edge, the output clock signal will have a logic low value when in transition.

In one embodiment, the clock routing circuit includes a first flip-flop that is clocked by the primary clock signal and a second flip-flop that is clocked by the secondary clock signal. A first logic gate has a first input terminal coupled to a data output terminal of the second flip-flop, a second input terminal coupled to receive a select signal, and an output terminal coupled to a data input terminal of the first flip-flop. A second logic gate has a first input terminal coupled to a data output terminal of the first flip-flop, a second input terminal coupled to receive the inverse of the select signal, and an output terminal coupled to a data input terminal of the first flip-flop. A first switch is configured to selectively route the primary clock signal to an output node as an output clock signal in response to the data output signal provided by the first flip-flop. Similarly, a second switch is configured to selectively route the secondary clock signal to the output node as the output clock signal in response to the data output signal provided by the second flip-flop. A keeper circuit is coupled to the output node, thereby enabling the voltage on the output node to be maintained when neither the first nor second switch are turned on.

In one embodiment, the clock routing circuit further includes a first multiplexer having input terminals coupled to receive the primary clock signal and the inverse of the primary clock signal, and an output terminal coupled to the clock input terminal of the first flip-flop. In this embodiment, the clock routing circuit can further include a second multiplexer having input terminals coupled to receive the secondary clock signal and the inverse of the secondary clock signal, and an output.terminal coupled to the clock input terminal of the second flip-flop.

The present invention will be more fully understood in view of the following description and drawings.

DETAILED DESCRIPTION OF THE DRAWINGS

Figure 1:
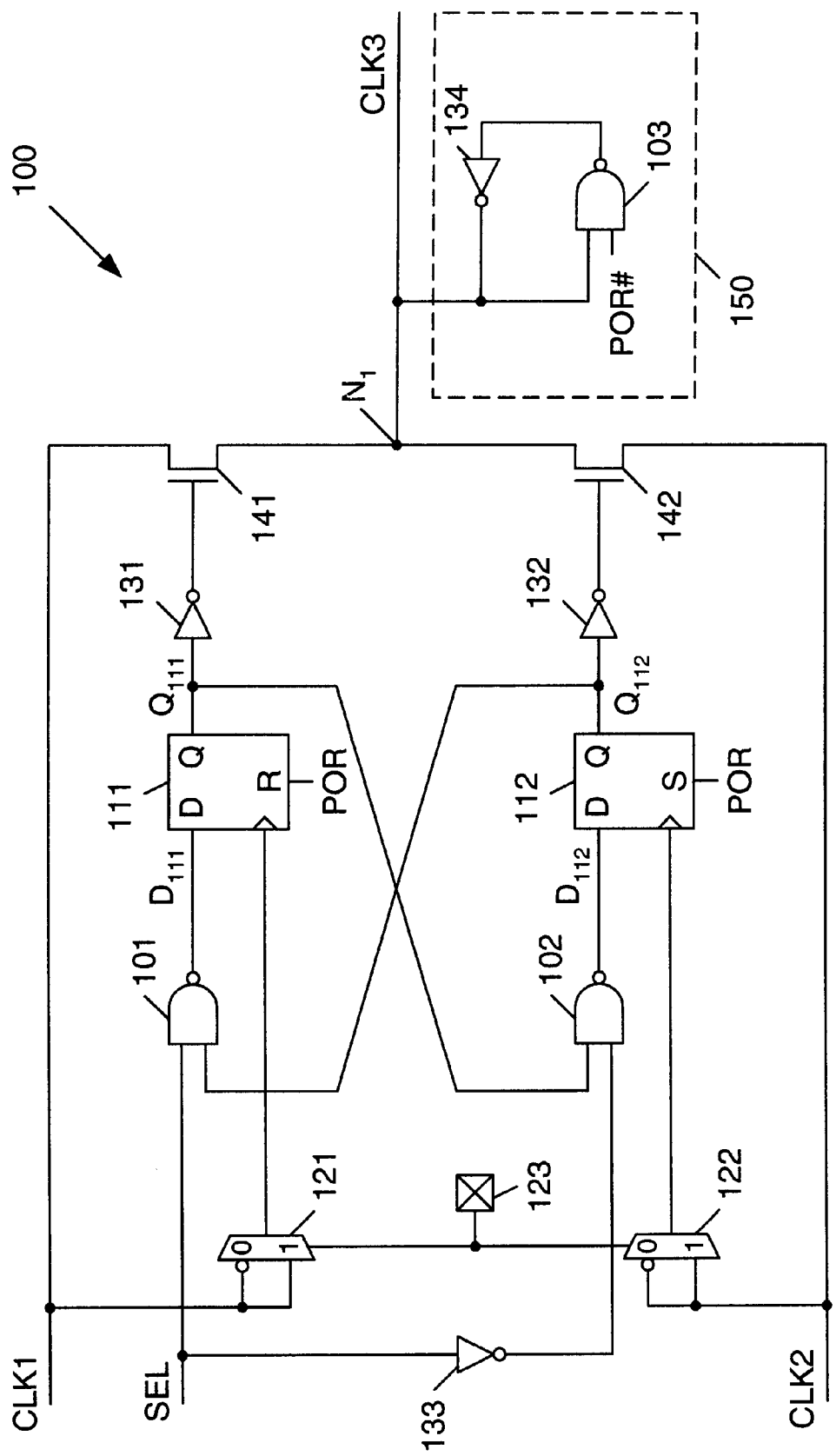
FIG. 1 is a schematic diagram of a clock routing circuit in accordance with one embodiment of the present invention.

FIG. 1 is a schematic diagram of clock routing circuit 100 in accordance with one embodiment of the present invention. Clock routing circuit 100 includes NAND gates 101–103, D-type flip-flops 111–112, 2-to-1 multiplexers 121–122, configuration memory cell 123, inverters 131–134 and n-channel pass transistors 141–142. Inverter 134 and NAND gate 103 are connected to form keeper circuit 150. While clock routing circuit 100 can be used for any type of integrated circuit, it is noted that clock routing circuit 100 is particularly intended for implementation on a field programmable logic device (FPGA).

A primary clock signal CLK1 is applied to inverting and non-inverting input terminals of multiplexer 121. Multiplexer 121 is controlled by a configuration value stored in configuration memory cell 123. Thus, if configuration memory cell 123 stores a logic "0" value, then multiplexer 121 routes the inverse of clock signal CLK1 (i.e., CLK1#). Conversely, if configuration memory cell 123 stores a logic "1" value, then multiplexer 121 routes the clock signal CLK1. The output terminal of multiplexer 121 is coupled to the clock input terminal of flip-flop 111. In the described embodiment, flip-flop 111 is a rising edge triggered flip flop. As described below, multiplexer 121 effectively enables flip-flop 111 to be triggered by either the rising edges or the falling edges of the CLK1 signal.

A secondary clock signal CLK2 is applied to inverting and non-inverting input terminals of multiplexer 122. Multiplexer 122 is also controlled by a configuration value stored in configuration memory cell 123. Thus, if configuration memory cell 123 stores a logic "0" value, then multiplexer 122 routes the inverse of clock signal CLK2 (i.e., CLK2#). Conversely, if configuration memory cell 123 stores a logic "1" value, then multiplexer 122 routes the clock signal CLK2. The output terminal of multiplexer 122 is coupled to the clock input terminal of flip-flop 112. In the described embodiment, flip-flop 112 is a rising edge triggered flip flop. As described in more detail below, multiplexer 122 effectively enables flip-flop 112 to be triggered by either the rising edges or the falling edges of the CLK2 signal.

A clock select signal SEL is provided to an input terminal of NAND gate 101. The Q output terminal of flip-flop 112, which carries output signal $Q_{112}$, is coupled to the other input terminal of NAND gate 101. The clock select signal SEL is also provided to inverter 133. In response, inverter 133 provides the inverse of the clock select signal SEL to an input terminal of NAND gate 102. The Q output terminal of flip-flop 111, which carries output signal $Q_{111}$, is coupled to the other input terminal of NAND gate 102.

NAND gate 101 provides input signal $D_{111}$ to the D input terminal of flip-flop 111. NAND gate 102 provides input signal $D_{112}$ to the D input terminal of flip-flop 112. Flip-flop 111 has a reset input terminal (R) coupled to receive a power-on-reset signal POR. Flip-flop 112 has a set input terminal (S) coupled to receive the power-on-reset signal POR.

The output terminals of flip-flops 111 and 112 are further connected to input terminals of inverters 131 and 132, respectively. The output terminals of inverters 131 and 132 are coupled to gate electrodes of pass transistors 141 and 142, respectively. The CLK1 and CLK2 signals are provided to the drain terminals of pass transistors 141 and 142, respectively. The source terminals of pass transistors 141 and 142 are commonly connected to node N1. The signal on node N1 is provided as the output clock signal CLK3.

Node N1 is further coupled to an input terminal of NAND gate 103. The other input terminal of NAND gate 103 is coupled to receive the inverse of the POR signal (i.e., POR#). The output terminal of NAND gate 103 is connected to the input terminal of inverter 134. The output terminal of inverter 134 is connected to node N1. When the POR# signal has a logic high value, NAND gate 103 is configured as an inverter. Under these conditions, NAND gate 103 and inverter 134 form a keeper circuit that is capable of holding the state of the signal on node N1. Note that inverter 134 and NAND gate 103 are designed to be relatively weak devices relative to pass transistors 141 and 142. As a result, when clock signals CLK1 and CLK2 are driven onto node N1, these clock signals can easily change the state of node N1.

In one embodiment, the CLK1 and CLK2 signals are received on input pads of the user-defined logic device. The CLK3 signal is a global clock signal used by the user-defined logic device. Both the CLK1 and CLK2 signals are available for use within the user-defined logic device. Clock routing circuit 100 is implemented for each global clock input on the user-defined logic device and is activated by configuration memory cell bits. Clock routing circuit 100 is located at the periphery of the user-defined logic device (e.g., at the four corners of the device) and is not part of the core programmable logic of the device (e.g., not in the configurable logic block array). Thus, any process requiring a synchronous system clock receives either the CLK1 signal or the CLK2 signal, depending on the requirements of each process. In the described embodiment, the CLK3 signal follows the CLK1 or CLK2 signal with only one pass gate delay being added by clock routing circuit 100.

Figure 2:
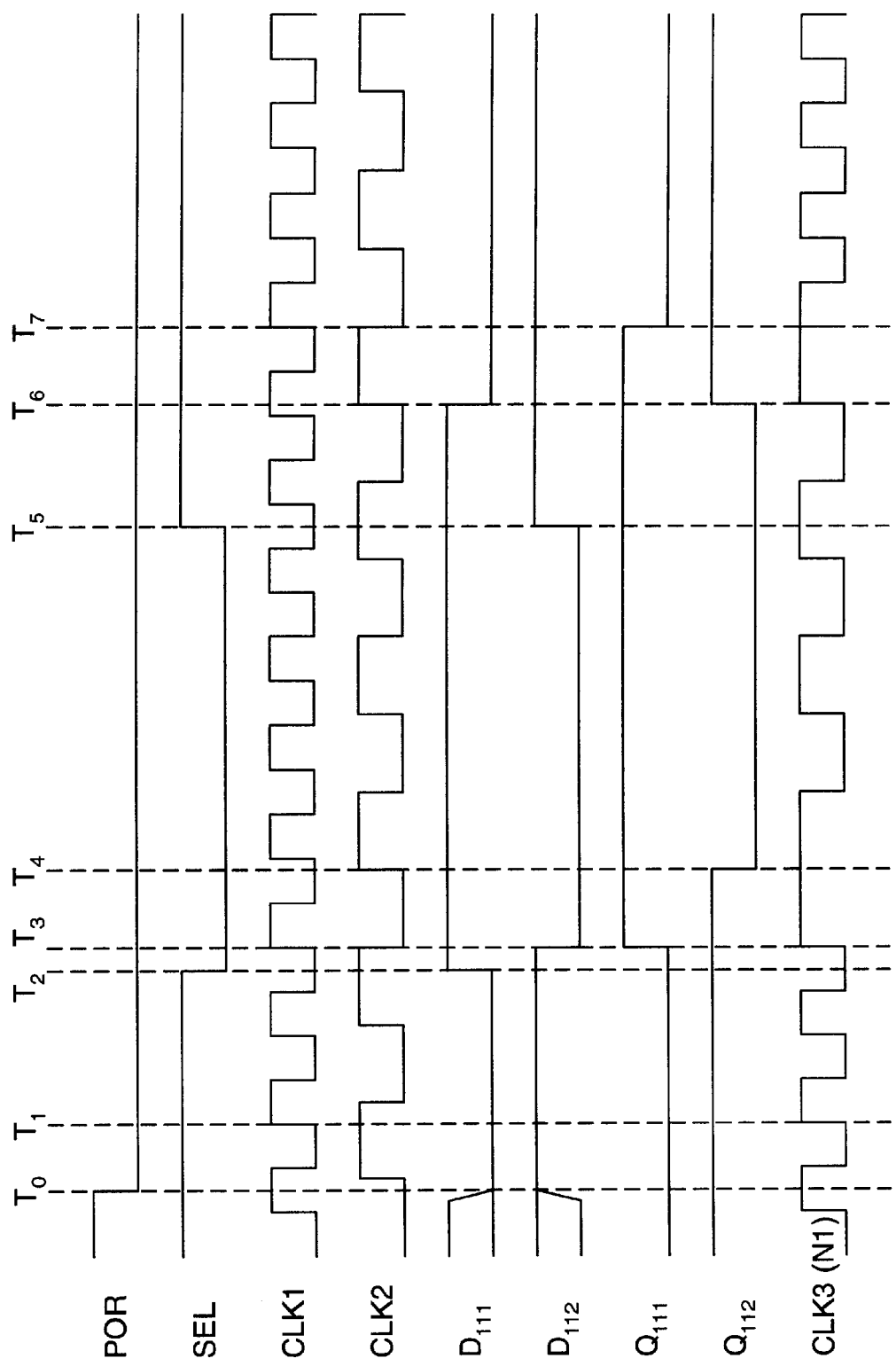
FIG. 2 is a waveform diagram of the timing signals of the clock routing circuit of FIG. 1 when configured to operate in response to the rising edges of the clock signals.

The operation of clock routing circuit 100 will now be described. FIG. 2 is a waveform diagram illustrating the signal timing of clock routing circuit 100 in accordance with one example. Note that signal delays are not represented in FIG. 2. In the waveform diagram of FIG. 2, configuration memory cell 123 is programmed to store a logic "1" configuration data value. As a result, multiplexers 121 and 122 pass the CLK1 and CLK2 signals to flip-flops 111 and 112, respectively.

Prior to time $T_0$, the power-on-reset signal POR is in a logic high state (and the POR# signal is in a logic low state). Flip-flop 111 is reset and flip-flop 112 is set in response to the logic high POR signal. As a result, flip-flop 111 provides a logic low output signal $Q_{111}$, and flip-flop 112 provides a logic high output signal $Q_{112}$. The logic low POR# signal causes NAND gate 103 to provide a logic high output signal to inverter 134. In response, inverter 134 provides a logic low signal to node N1. However, as described below, the status of node N1 is not determined by inverter 134 at this time, but rather by the CLK1 signal. Note that NAND gate 103 is provided to achieve power savings during the power on process. NAND gate 103 can be replaced with a weak inverter in another embodiment of the present invention.

Prior to time $T_0$, the logic low $Q_{111}$ signal causes inverter 131 to provide a logic high value to the gate of n-channel pass transistor 141. As a result, pass transistor 141 is turned on, thereby routing the primary clock signal CLK1 to node N1 as the CLK3 signal. Note that the CLK1 signal overpowers keeper circuit 150. At this time, the logic high $Q_{112}$ signal causes inverter 132 to provide a logic low value to the gate of transistor 142, thereby turning off this transistor 142. At time $T_0$, the power-on-reset signal POR transitions to a logic low state (and the POR# signal transitions to a logic high state). The logic low POR signal "releases" flip-flops 111 and 112, thereby enabling these flip-flops to respond to the applied data and clock signals. The logic high POR# signal applied to NAND gate 103 causes this NAND gate to operate as an inverter. At this time, NAND gate 103 and inverter 134 operate as a keeper circuit that maintains the last logic value driven onto node N1, provided that node N1 is not being driven by one of the clock signals CLK1 or CLK2.

In the described example, the clock select signal SEL has a logic high state, thereby indicating that the primary clock signal CLK1 is to be selected. The logic high SEL signal is applied to an input terminal of NAND gate 101. The other input terminal of NAND gate 101 is coupled to receive the logic high $Q_{112}$ signal. As a result, NAND gate 101 provides a logic low signal $D_{111}$ to flip-flop 111. Even though the $D_{111}$ signal has a logic low value, this value is not clocked into flip-flop 111 until the next rising edge of the CLK1 signal.

The logic high SEL signal further causes inverter 133 to provide a logic low signal to an input terminal of NAND gate 102. The other input terminal of NAND gate 102 is coupled to receive the logic low $Q_{111}$ signal. As a result, NAND gate 102 provides a logic high signal $D_{112}$ to flip-flop 112.

At time $T_1$, the CLK1 signal transitions from a logic low state to a logic high state (rising edge), thereby clocking the logic low $D_{111}$ signal into flip-flop 111. When the logic low $D_{111}$ signal is latched into flip-flop 111, the $Q_{111}$ signal remains in a logic low value. in response to the logic low $Q_{111}$ signal, inverter 131 continues to provide a logic high voltage to the gate of pass transistor 141. Thus, pass transistor 141 remains on, thereby enabling the CLK1 signal to pass to node N1 as the CLK3 signal. Note that there are no glitches in the CLK3 signal.

After time $T_1$, clock routing circuit 100 will continue to route the CLK1 signal as the CLK3 output signal until the clock select signal SEL changes states. At time $T_2$, the SEL signal transitions from a logic high state to a logic low state, thereby indicating that the output clock signal CLK3 should be changed from the primary clock signal CLK1 to the secondary clock signal CLK2. In all embodiments described herein, the clock select signal SEL is an asynchronous signal that can be asserted or de-asserted at any time. The logic low SEL signal is applied to an input terminal of NAND gate 101, thereby causing NAND gate 101 to provide a logic high $D_{111}$ signal to flip-flop 111. Note that this logic high $D_{111}$ signal is not latched into flip-flop 111 until the next rising edge of the CLK1 signal. As a result, pass transistor 141 continues to pass the CLK1 signal after time $T_2$.

The logic low SEL signal also causes inverter 133 to provide a logic high value to an input terminal of NAND gate 102. However, because the $Q_{111}$ value still has a logic low value at this time, NAND gate 102 continues to provide a logic high $D_{112}$ signal.

At time $T_3$, the CLK1 signal transitions from a logic low state to a logic high state (rising edge), thereby applying a logic high value to node N1 and clocking the logic high $D_{111}$ signal into flip-flop 111. When the logic high $D_{111}$ signal is latched into flip-flop 111, the $Q_{111}$ signal transitions to a logic high value. In response to the logic high $Q_{111}$ signal, inverter 131 provides a logic low voltage to the gate of pass transistor 141. In response, pass transistor 141 turns off, thereby isolating node N1 from the CLK1 signal. Because the $Q_{112}$ signal also has a logic high value at this time, pass transistor 142 is also non-conducting. Under these conditions, keeper circuit 150 stores the last state driven onto node N1. That is, keeper circuit 150 maintains node N1 at the logic high value applied at the rising edge of the CLK1 signal. The CLK3 signal remains latched at a logic high state until the next rising edge of the CLK2 signal, which occurs at time $T_4$.

Note that an acceptable race condition exists at time $T_3$, wherein the CLK1 signal must transition to a logic high state and be routed through turned on pass transistor 141 before pass transistor 141 is turned off in response to the rising edge of the CLK1 signal.

Also at time $T_3$, the logic high $Q_{111}$ signal is provided to NAND gate 102. Because both inputs to NAND gate 102 are high at this time, NAND gate 102 provides a logic low $D_{112}$ signal to flip-flop 112. However, this logic low $D_{112}$ signal is not latched into flip-flop 112 until the next rising edge of clock signal CLK2.

At time $T_4$, the CLK2 signal transitions from a logic low state to a logic high state (rising edge), thereby clocking the logic low $D_{112}$ signal into flip-flop 112. When the logic low $D_{112}$ signal is latched into flip-flop 112, the $Q_{112}$ signal transitions to a logic low value. In response to the logic low $Q_{112}$ signal, inverter 132 provides a logic high voltage to the gate of pass transistor 142. In response, pass transistor 142 turns on, thereby coupling node N1 to receive the CLK2 signal. As a result, the CLK2 signal is transmitted as the CLK3 signal. Note that there are no glitches in the CLK3 signal because node N1 is held at a logic high value prior to time $T_4$ by keeper circuit 150, and node N1 is coupled to receive the logic high CLK2 signal, which will necessarily have a logic high value after time $T_4$.

After time $T_4$, clock routing circuit 100 will route the CLK2 signal as the CLK3 output signal until the clock select signal SEL changes states. At time $T_5$, the SEL signal transitions from a logic low state to a logic high state, thereby indicating that the output clock signal CLK3 should be changed from the CLK2 signal to the CLK1 signal. The logic high SEL signal causes inverter 133 to provide a logic low signal to an input terminal of NAND gate 102, thereby causing NAND gate 102 to provide a logic high $D_{112}$ signal to flip-flop 112. Note that this logic high $D_{112}$ signal is not latched into flip-flop 112 until the next rising edge of the CLK2 signal. As a result, pass transistor 142 continues to pass the CLK2 signal after time $T_5$.

The logic high SEL signal is also provided to an input terminal of NAND gate 101. However, because the $Q_{112}$ value still has a logic low value at this time, NAND gate 101 continues to provide a logic high $D_{111}$ signal.

At time $T_6$, the CLK2 signal transitions from a logic low state to a logic high state (rising edge), thereby applying a logic high value to node N1 and clocking the logic high $D_{112}$ signal into flip-flop 112. When the logic high $D_{112}$ signal is latched into flip-flop 112, the $Q_{112}$ signal transitions to a logic high value. In response to the logic high $Q_{112}$ signal, inverter 132 provides a logic low voltage to the gate of pass transistor 142. In response, pass transistor 142 turns off, thereby isolating node N1 from the CLK2 signal. Because the $Q_{111}$ signal also has a logic high value at this time, pass transistor 141 is also turned off. Under these conditions, keeper circuit 150 stores the last state driven onto node N1.

That is, keeper circuit 150 maintains node N1 at the logic high value applied at the rising edge of the CLK2 signal. The CLK3 signal is maintained at a logic high state until the next rising edge of the CLK1 signal, which occurs at time $T_7$.

Note that an acceptable race condition exists at time $T_6$, wherein the CLK2 signal must transition to a logic high state and be routed through turned on pass transistor 142 before pass transistor 142 is turned off in response to the rising edge of the CLK2 signal.

Also. at time $T_6$, the logic high $Q_{111}$ signal is provided to NAND gate 101. Because both inputs to NAND gate 101 are high at this time, NAND gate 101 provides a logic low $D_{111}$ value to flip-flop 111. However, this logic low $D_{111}$ value is not latched into flip-flop 111 until the next rising edge of clock signal CLK1.

At time $T_7$, the CLK1 signal transitions from a logic low state to a logic high state, thereby clocking the logic low $D_{111}$ signal into flip-flop 111. When the logic low $D_{111}$ signal is latched into flip-flop 111, the $Q_{111}$ signal transitions to a logic low value. In response to the logic low $Q_{111}$ signal, inverter 131 provides a logic high voltage to the gate of pass transistor 141. In response, pass transistor 141 turns on, thereby coupling node N1 to receive the CLK1 signal. As a result, the CLK1 signal is transmitted as the CLK3 signal. Note that there are no glitches in the CLK3 signal because node N1 is held at a logic high value prior to time $T_7$ by keeper circuit 150, and node N1 is coupled to receive the logic high CLK1 signal, which will necessarily have a logic high value after time $T_7$.

After time $T_7$, clock routing circuit 100 will route the CLK1 signal as the CLK3 output signal until the clock select signal SEL changes states.

The above described example assumes that configuration memory cell 123 stores a logic "1" value, such that multiplexers 121 and 122 pass the CLK1 and CLK2 signals, respectively, to the clock input terminals of flip-flops 111 and 112, respectively. As described above, this configuration causes flip-flops 111 and 112 to be triggered by the rising edges of the CLK1 and CLK2 signals, respectively. However, if configuration memory cell 123 is programmed to store a logic "0" value, then multiplexers 121 and 122 will pass the inverse of the CLK1 and CLK2 signals to the clock input terminals of flip-flops 111 and 112, respectively. As a result, flip-flops 111 and 112 will be triggered by the falling edges of the CLK1 and CLK2 signals, respectively.

Figure 3:
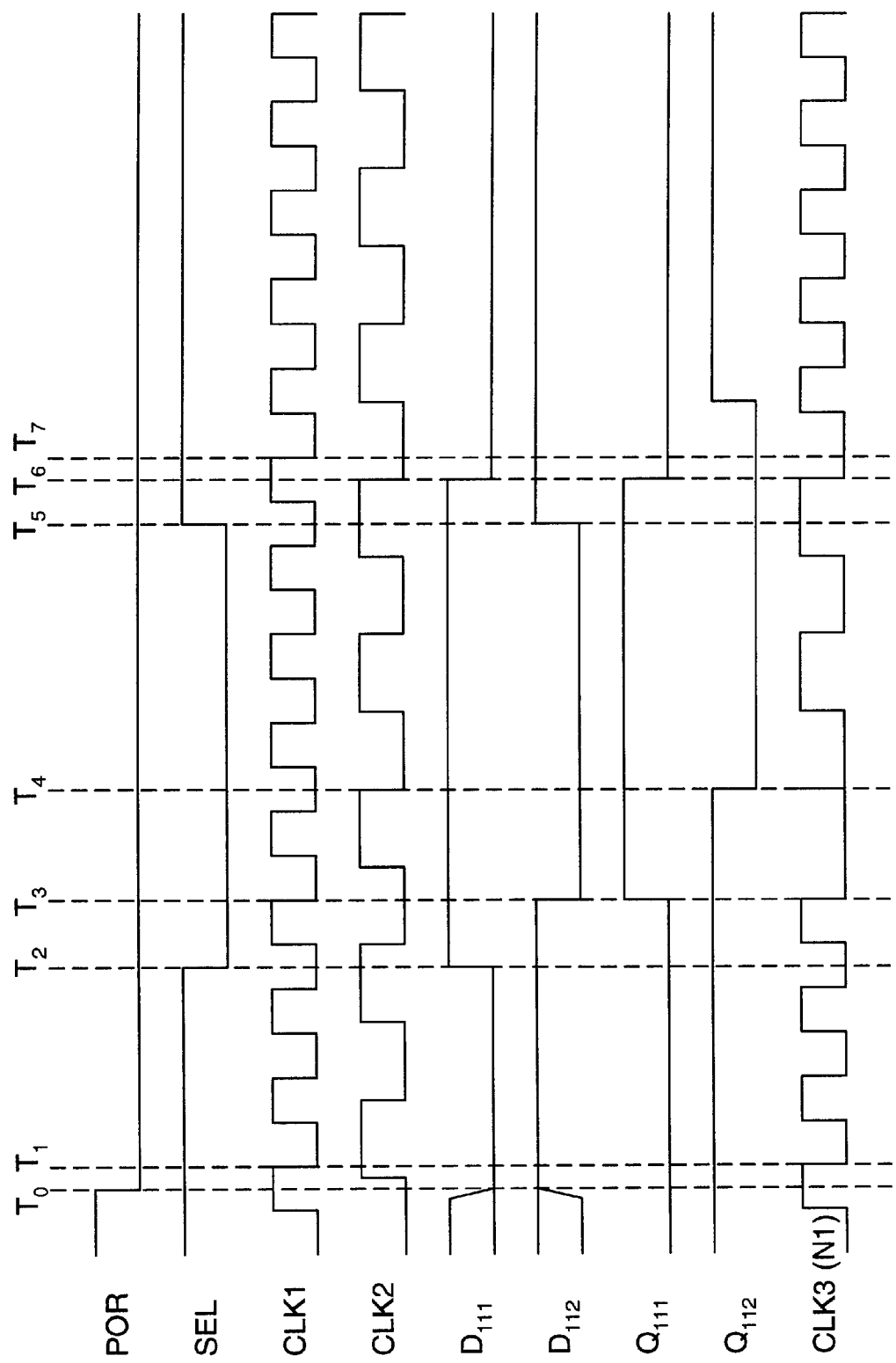
FIG. 3 is a waveform diagram of the timing signals of the clock routing circuit of FIG. 1 when configured to operate in response to the falling edges of the clock signals.

FIG. 3 is a waveform diagram illustrating the signal timing of clock routing circuit when configuration memory cell 123 is programmed to store a logic "0" value. The operation clock routing circuit 100 when configuration memory cell 123 stores a logic "0" value (FIG. 3) is similar to the operation of clock routing circuit 100 when configuration memory cell 123 stores a logic "1" value (FIG. 2). Thus, only the differences in operation will be described. In FIG. 3, the signal transitions occurring at times $T_1$, $T_3$ and $T_7$ are triggered by falling edges of the CLK1 signal (rather than by rising edges of the CLK1 signal). Similarly, in FIG. 3, the signal transitions occurring at times $T_4$ and $T_6$ are triggered by falling edges of the CLK2 signal (rather than by rising edges of the CLK2 signal). Finally, keeper circuit 150 holds the output clock signal CLK3 at a logic low value from time $T_3$ to time $T_4$, and from time $T_6$ to time $T_7$ (rather than at a logic high value). Again, the configuration of clock routing circuit 100 ensures that no clock glitches occur when switching is performed in response to the falling edges of the CLK1 and CLK2 signals.

In an alternative embodiment of the present invention, a constant value (i.e., either logic "1" or logic "0") is applied in place of the secondary clock signal CLK2. As described below, this configuration causes clock routing circuit 100 to operate as a glitch-free clock gating circuit. A clock gating circuit is a circuit that can be controlled to route either a clock signal or a predetermined constant value.

Figure 4:
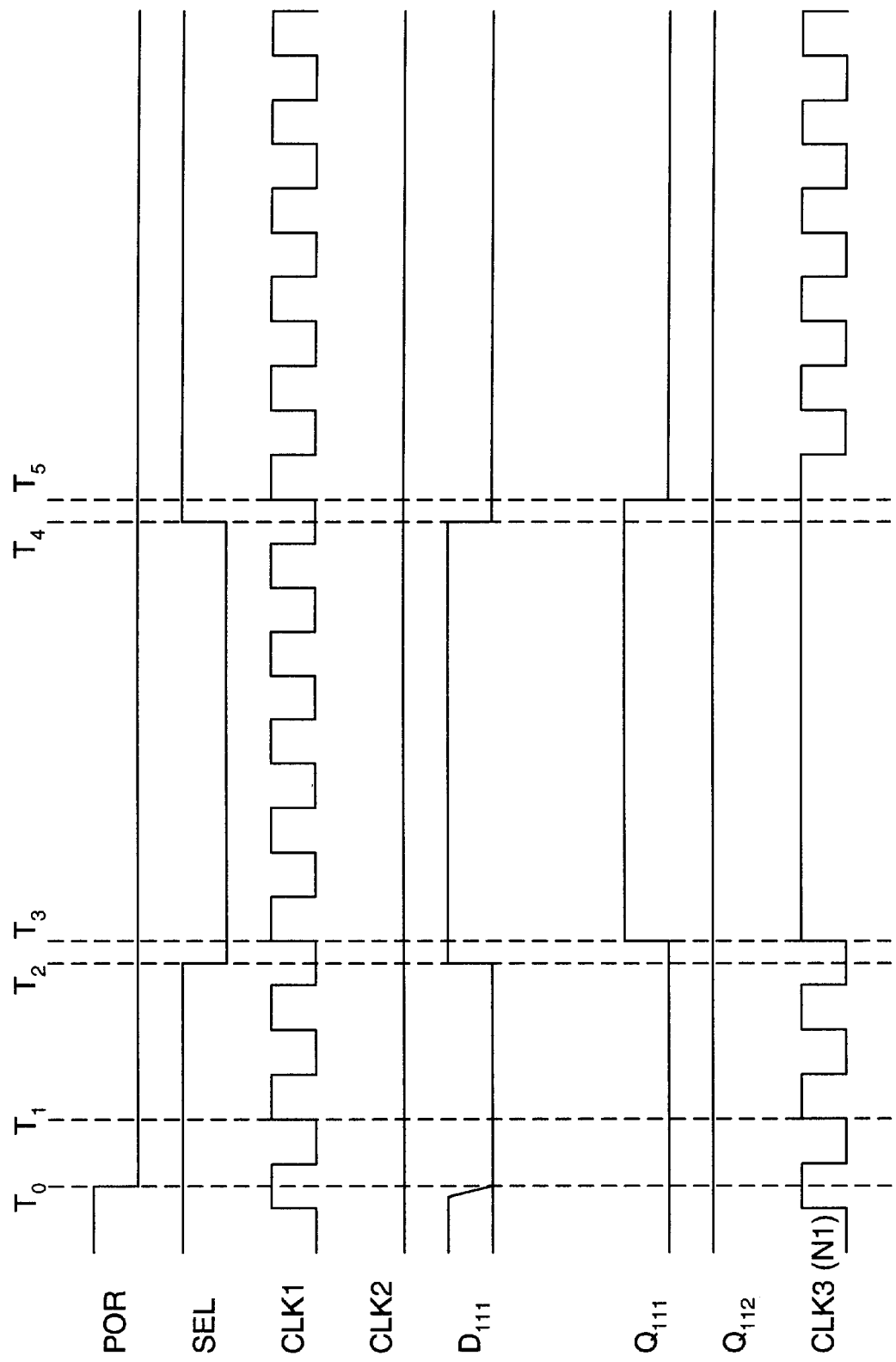
FIG. 4 is a waveform diagram of the timing signals of the clock routing circuit of FIG. 1 when configured to operate as a clock gating circuit in response to rising clock edges.

FIG. 4 is a waveform diagram illustrating signals of clock routing circuit 100, when this circuit is configured to operate as a clock gating circuit. In the present example, the secondary clock signal CLK2 is replaced with a constant logic "0" value, and configuration memory cell 123 is programmed to store a logic "1" value. The logic "1" value stored in configuration memory cell 123 causes the constant logic "0" value of the CLK2 signal to be routed to the clock input terminal of flip-flop 112. Because the signal applied to the clock input terminal of flip-flop 112 does not change states, the $Q_{112}$ output signal provided by flip-flop 112 does not change states. Because the $Q_{112}$ signal is initially set to a logic "1" value in response to the logic high POR signal, the $Q_{112}$ signal remains at a logic "1" value during the operation of the clock routing circuit 100. Pass transistor 142 is turned off in response to the logic high $Q_{112}$ signal.

The $Q_{111}$ signal is initially reset to a logic "0" value in response to the logic high POR signal. As a result, pass transistor 141 is turned on, thereby routing the primary clock signal CLK1 as the output clock signal CLK3. In response to the logic "1" value of the $Q_{112}$ signal, NAND gate 101 functions as an inverter which provides a $D_{111}$ signal that is the inverse of the clock select signal SEL. At time $T_0$, the SEL signal has a logic "1" value, thereby causing NAND gate 101 to provide a $D_{111}$ signal having a logic "0" value.

At time $T_1$, the CLK1 signal transitions from a logic low state to a logic high state (rising edge), thereby clocking the logic low $D_{111}$ signal into flip-flop 111. When the logic low $D_{111}$ signal is latched into flip-flop 111, the $Q_{111}$ signal transitions to a logic low value. In response to the logic low $Q_{111}$ signal, inverter 131 continues to provide a logic high voltage to the gate of pass transistor 141. Thus, pass transistor 141 remains turned on, thereby passing the CLK1 signal to node N1 as the CLK3 signal.

After time $T_1$, clock routing circuit 100 will route the CLK1 signal as the CLK3 output signal.until the clock select signal SEL changes states. At time $T_2$, the SEL signal transitions from a logic high state to a logic low state, thereby indicating that the output clock signal CLK3 should be changed from the CLK1 signal to a predetermined constant value. The logic low SEL signal is applied to an input terminal of NAND gate 101, thereby causing NAND gate 101 to provide a logic high $D_{111}$ signal to flip-flop 111. Note that this logic high $D_{111}$ signal is not latched into flip-flop 111 until the next rising edge of the CLK1 signal. As a result, pass transistor 141 continues.to pass the CLK1 signal after time $T_2$.

At time $T_3$, the CLK1 signal transitions from a logic low state to a logic high state (rising edge), thereby applying a logic high value to node N1 and clocking the logic high $D_{111}$ signal into flip-flop 111. When the logic high $D_{111}$ signal is latched into flip-flop 111, the $Q_{111}$ signal transitions to a logic high value. In response to the logic high $Q_{111}$ signal, inverter 131 provides a logic low voltage to the gate of pass transistor 141. In response, pass transistor 141 turns off, thereby isolating node N1 from the CLK1 signal. Because pass transistor 142 is also turned off, keeper circuit 150 stores the last state driven onto node N1. That is, keeper circuit 150 maintains node N1 at the logic high value applied at the rising. edge of the CLK1 signal. The CLK3 signal is maintained at a logic high state until after the SEL signal transitions to a logic "1" value.

At time $T_4$, the SEL signal transitions from a logic low state to a logic high state, thereby indicating that the output clock signal CLK3 should be changed from the predetermined constant value to the CLK1 signal. The logic high SEL signal is applied to an input terminal of NAND gate 101, thereby causing NAND gate 101 to provide a logic low $D_{111}$ signal to flip-flop 111. Note that this logic low $D_{111}$ signal is not latched into flip-flop 111 until the next rising edge of the CLK1 signal. As a result, keeper circuit 150 continues to maintain the logic high value on node N1.

At time $T_5$, the CLK1 signal transitions from a logic low state to a logic high state (rising edge), thereby applying a logic high value to node N1 and clocking the logic low $D_{111}$ signal into flip-flop 111. When the logic low $D_{111}$ signal is latched into flip-flop 111, the $Q_{111}$ signal transitions to a logic low value. In response to the logic low $Q_{111}$ signal, inverter 131 provides a logic high voltage to the gate of pass transistor 141. In response, pass transistor 141 turns on, thereby routing the. CLK1 signal to node N1. As a result, the CLK1 signal is transmitted as the CLK3 signal. Note that there are no glitches in the CLK3 signal because node N1 is held at a logic high value prior to time $T_5$ by keeper circuit 150 and node N1 is coupled to receive the logic high CLK1 signal, which will necessarily have a logic high value after time $T_5$.

Note that there are no glitches in the CLK3 signal because node N1 is held at a logic high value prior to time $T_5$ by keeper circuit 150, and node N1 is coupled to receive the logic high CLK1 signal, which will necessarily have a logic high value after time $T_5$.

The above described example assumes that configuration memory cell 123 stores a logic "1" value, such that multiplexer 121 passes the CLK1 signal to the clock input terminal of flip-flop 111. As described above, this configuration causes flip-flop 111 to be triggered by the rising edge of the CLK1 signal. However, if configuration memory cell 123 is programmed to store a logic "0" value, then multiplexer 121 will pass the inverse of the CLK1 signal to the clock input terminal of flip-flop 111. As a result, flip-flop 111 will be triggered by the falling edges of the CLK1 signal.

Figure 5:
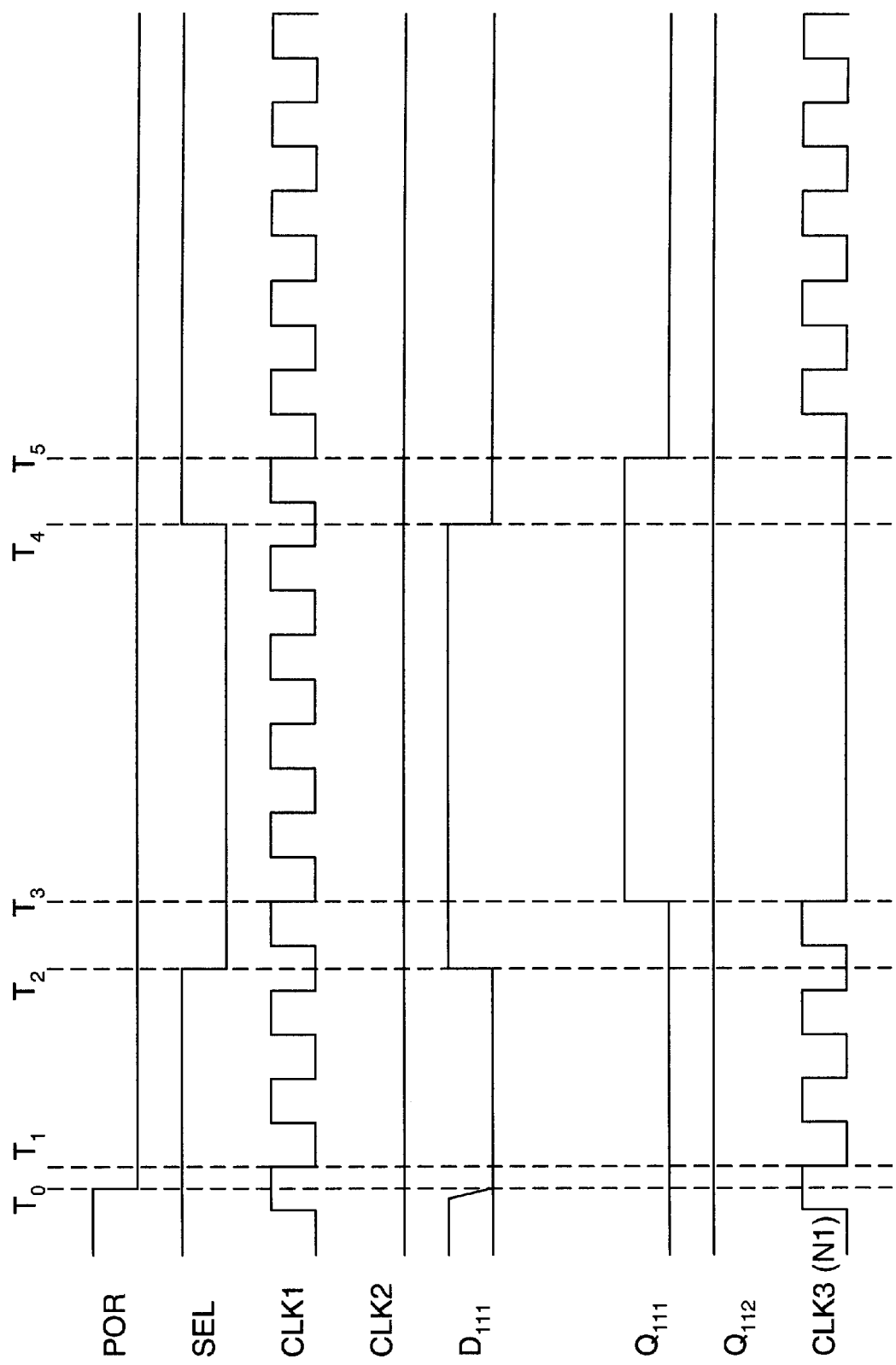
FIG. 5 is a waveform diagram of the timing signals of the clock routing circuit of FIG. 1 when configured to operate as a clock gating circuit in response to falling clock edges.

FIG. 5 is a waveform diagram illustrating the signal timing of clock routing circuit 100 when configuration memory cell 123 is programmed to store a logic "0" value. The operation clock routing circuit 100 when configuration memory cell 123 stores a logic "0" value (FIG. 5) is similar to the operation of clock routing circuit 100 when configuration memory cell 123 stores a logic "1" value (FIG. 4). Thus, only the differences in operation will be described. In FIG. 5, the signal transitions occurring at times $T_1$, $T_3$ and $T_5$ are triggered by falling edges of the CLK1 signal (rather than by rising edges of the CLK1 signal). In addition, keeper circuit 150 holds the output clock signal CLK3 at a logic low value from time $T_3$ to time $T_5$ (rather than at a logic high value). Again, the configuration of clock routing circuit 100 ensures that no clock glitches occur when switching is performed in response to the falling edges of the CLK1 signal.

Although the invention has been described in connection with several embodiments, it is understood that this invention is not limited to the embodiments disclosed, but is capable of various modifications which would be apparent to a person skilled in the art. For example, additional circuitry can be added to clock routing circuit 100 to improve the pull-up voltage on node N1. In one embodiment, this additional circuitry includes a pair of p-channel pass transistors. One of these p-channel pass transistors is connected in parallel with n-channel pass transistor 141 between node N1 and the terminal receiving the CLK1 signal. The gate of this first p-channel pass transistor is coupled to receive the $Q_{111}$ signal. This first p-channel pass transistor helps node N1 to be pulled up to the full $V_{CC}$ supply voltage in response to the CLK1 signal. The other p-channel pass transistor is connected in parallel with n-channel pass transistor 142 between node N1 and the terminal receiving the CLK2 signal. The gate of this second p-channel pass transistor is coupled to receive the $Q_{112}$ signal. This second p-channel pass transistor helps node N1 to be pulled up to the full $V_{CC}$ supply voltage in response to the CLK2 signal. Thus, the invention is limited only by the following claims.

I claim:

1. A method of routing a first clock signal or a second clock signal as an output clock signal in response to a select signal, the method comprising the steps of:

routing the first clock signal, as the output clock signal when the select signal has a first logic value;

continuing to route the first clock signal as the output clock signal when the select signal initially transitions to a second logic value at time $T_A$;

holding the output clock signal at a first state the first time the first clock signal transitions to the first state after time $T_A$, the first clock signal transitioning to the first state at time $T_B$; and then routing the second clock signal as the output clock signal the first time the second clock signal transitions to the first state after time $T_B$.

2. The method of claim 1, wherein the first clock signal, the second clock signal and the select signal are asynchronous.

3. The method of claim 1, further comprising the step of selecting the first state to be a logic high state or a logic low state.

4. The method of claim 1, further comprising the step of replacing the second clock signal with a signal having a constant value.

5. The method of claim 1, further comprising the steps of:

continuing to route the second clock signal as the output clock signal when the select signal initially transitions to the first logic value at time $T_C$;

holding the output clock signal at the first state the first time the second clock signal transitions to the first state after time $T_C$, the second clock signal transitioning to the first state at time $T_D$; and then routing the first clock signal as the output clock signal the first time the first clock signal transitions to the first state after time $T_D$.

6. A clock routing circuit comprising:

a first flip-flop having a clock input terminal coupled to receive a first clock signal;

a second flip-flop having a clock input terminal coupled to receive a second clock signal;

a first logic gate having a first input terminal coupled to a data output terminal of the second flip-flop, a second input terminal coupled to receive a select signal, and an output terminal coupled to a data input terminal of the first flip-flop;

a second logic gate having a first input terminal coupled to a data output terminal of the first flip-flop, a second input terminal coupled to receive the inverse of the select signal, and an output terminal coupled to a data input terminal of the first flip-flop;

a first switch configured to selectively route the first clock signal to an output node in response to a signal provided on the output terminal of the first flip-flop;

a second switch configured to selectively route the second clock signal to the output node in response to a signal provided on the output terminal of the second flip-flop; and a keeper circuit coupled to the output node.

7. The clock routing circuit of claim 6, wherein the first logic gate and the second logic gate are logical NAND gates.

8. The clock routing circuit of claim 6, wherein the first switch and the second switch each include a pass transistor coupled to the output node.

9. The clock routing circuit of claim 6, further comprising a first multiplexer having input terminals coupled to receive the first clock signal and the inverse of the first clock signal, and an output terminal coupled to the clock input terminal of the first flip-flop.

10. The clock routing circuit of claim 9, further comprising a second multiplexer having input terminals coupled to receive the second clock signal and the inverse of the second clock signal, and an output terminal coupled to the clock input terminal of the second flip-flop.

11. The clock routing circuit of claim 10, further comprising a configuration memory cell coupled control terminals of both the first multiplexer and the second multiplexer.

12. The clock routing circuit of claim 6, wherein the first and second flip-flops each have a set input terminal coupled to receive an initialization signal.

13. The clock routing circuit of claim 7, wherein the keeper circuit comprises a third logic gate cross coupled with a fourth logic gate, wherein the third logic gate has an input terminal coupled to receive the initialization signal.

14. The clock routing circuit of claim 13, wherein the third logic gate is a NAND gate and the fourth logic gate is an inverter.

15. A clock routing circuit for routing a first clock signal or a second clock signal as an output clock signal in response to a select signal, the clock routing circuit comprising:

means for routing the first clock signal as the output clock signal when the select signal has a first logic value;

means for continuing to route the first clock signal as the output clock signal when the select signal initially transitions to a second logic value at time $T_A$;

means for holding the output clock signal at a first state the first time the first clock signal transitions to the first state after time $T_A$, the first clock signal transitioning to the first state at time $T_B$; and means for routing the second clock signal as the output clock signal the first time the second clock signal transitions to the first state after time $T_B$.

16. The clock routing circuit of claim 15, wherein the first clock signal, the second clock signal and the select signal are asynchronous.

17. The clock routing circuit of claim 15, further comprising means for selecting the first state to be a logic high state or a logic low state.

18. The clock routing circuit of claim 15, further comprising means for replacing the second clock signal with a signal having a constant value.

19. The clock routing circuit of claim 15, further comprising:

means for continuing to route the second clock signal as the output clock signal when the select signal initially transitions to the first logic value at time $T_C$;

means for holding the output clock signal at the first state the first time the second clock signal transitions to the first state after time $T_C$, the second clock signal transitioning to the first state at time $T_D$; and means for routing the first clock signal as the output clock signal the first time the first clock signal transitions to the first state after time $T_D$.

20. The clock routing circuit of claim 15, wherein the clock routing circuit is located on a field programmable logic device.

* * * * *